(12) United States Patent
Nojima et al.

(10) Patent No.: US 12,315,564 B2
(45) Date of Patent: May 27, 2025

(54) SEMICONDUCTOR MEMORY DEVICE

(71) Applicant: Kioxia Corporation, Tokyo (JP)

(72) Inventors: Kazuhiro Nojima, Mie (JP); Kohei Yuki, Yokkaichi (JP)

(73) Assignee: Kioxia Corporation, Tokyo (JP)

( * ) Notice: Subject to any disclaimer, the term of this patent is extended or adjusted under 35 U.S.C. 154(b) by 859 days.

(21) Appl. No.: 17/349,501

(22) Filed: Jun. 16, 2021

(65) Prior Publication Data

US 2022/0093176 A1    Mar. 24, 2022

(30) Foreign Application Priority Data

Sep. 18, 2020    (JP) ................. 2020-157519

(51) Int. Cl.

| | | |
|---|---|---|
| *G11C 16/04* | (2006.01) | |
| *H01L 23/528* | (2006.01) | |
| *H10B 41/10* | (2023.01) | |
| *H10B 41/20* | (2023.01) | |
| *H10B 41/35* | (2023.01) | |
| *H10B 43/10* | (2023.01) | |
| *H10B 43/20* | (2023.01) | |
| *H10B 43/35* | (2023.01) | |

(Continued)

(52) U.S. Cl.
CPC ...... *G11C 16/0483* (2013.01); *H01L 23/5283* (2013.01); *H10B 41/10* (2023.02); *H10B 41/20* (2023.02); *H10B 41/35* (2023.02); *H10B 43/10* (2023.02); *H10B 43/20* (2023.02); *H10B 43/35* (2023.02); *H10B 43/40* (2023.02); *H10B 43/50* (2023.02)

(58) Field of Classification Search
CPC . G11C 16/0483; H01L 23/5283; H10B 41/10; H10B 41/20; H10B 41/35; H10B 43/10; H10B 43/20; H10B 43/35; H10B 43/27; H10B 43/50; H10B 43/40
See application file for complete search history.

(56) References Cited

U.S. PATENT DOCUMENTS

| | | |
|---|---|---|
| 11,114,458 B2 | 9/2021 | Huo et al. |
| 2017/0194345 A1 | 7/2017 | Nojima |

(Continued)

FOREIGN PATENT DOCUMENTS

| | | |
|---|---|---|
| JP | 2019-67825 A | 4/2019 |
| JP | 2019-149445 A | 9/2019 |

(Continued)

*Primary Examiner* — Marcos D. Pizarro
(74) *Attorney, Agent, or Firm* — Oblon, McClelland, Maier & Neustadt, L.L.P.

(57) ABSTRACT

According to one embodiment, a semiconductor memory device includes a stacked layer body including conductive and insulating layers alternately stacked in a first direction, partition structures each extending in first and second directions in the stacked layer body, and an intermediate structure extending from an upper end and terminating at a position between upper and lower ends of the stacked layer body between adjacent partition structures. The partition structures include a first partition structure including first and second portions arranged in the second direction, the first portion extends from the upper end to the lower end, and the second portion is located between adjacent first portions, extends from the upper end and terminates at the position between the upper and lower ends.

20 Claims, 18 Drawing Sheets

(51) Int. Cl.
*H10B 43/40* (2023.01)
*H10B 43/50* (2023.01)

(56) References Cited

U.S. PATENT DOCUMENTS

| | | | |
|---|---|---|---|
| 2017/0358593 A1* | 12/2017 | Yu | ......................... H10B 43/27 |
| 2018/0130814 A1 | 5/2018 | Lee | |
| 2019/0096899 A1 | 3/2019 | Tagami et al. | |
| 2019/0267393 A1 | 8/2019 | Aoyama | |
| 2020/0185408 A1 | 6/2020 | Song et al. | |
| 2020/0395376 A1 | 12/2020 | Huo. et al. | |

FOREIGN PATENT DOCUMENTS

| KR | 10-2015-0116995 A | 10/2015 |
|---|---|---|
| TW | 201830670 A | 8/2018 |
| TW | 202023030 A | 6/2020 |

* cited by examiner

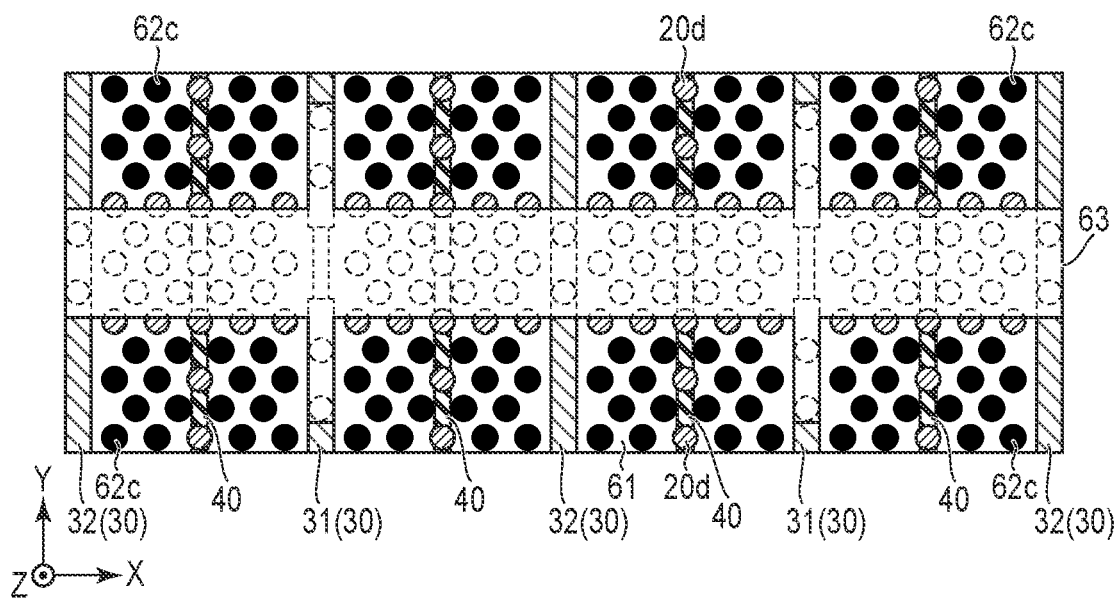
F I G. 9A
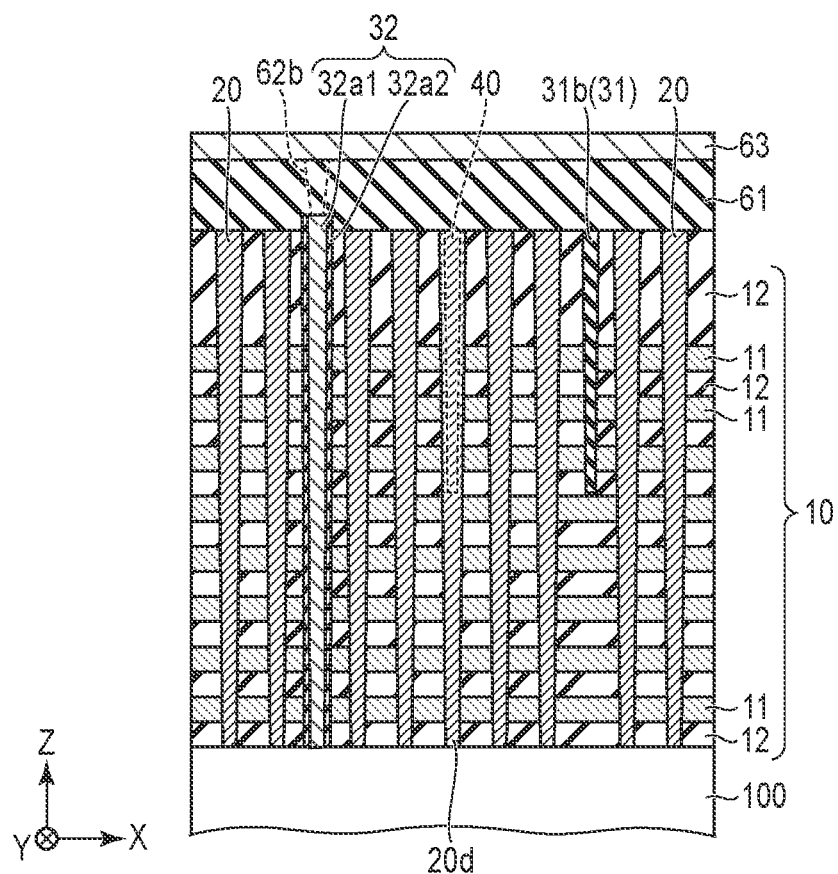
F I G. 9B

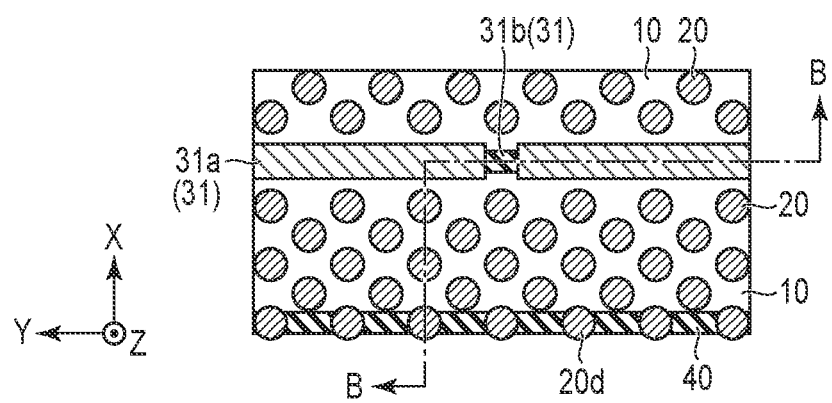
F I G. 14A
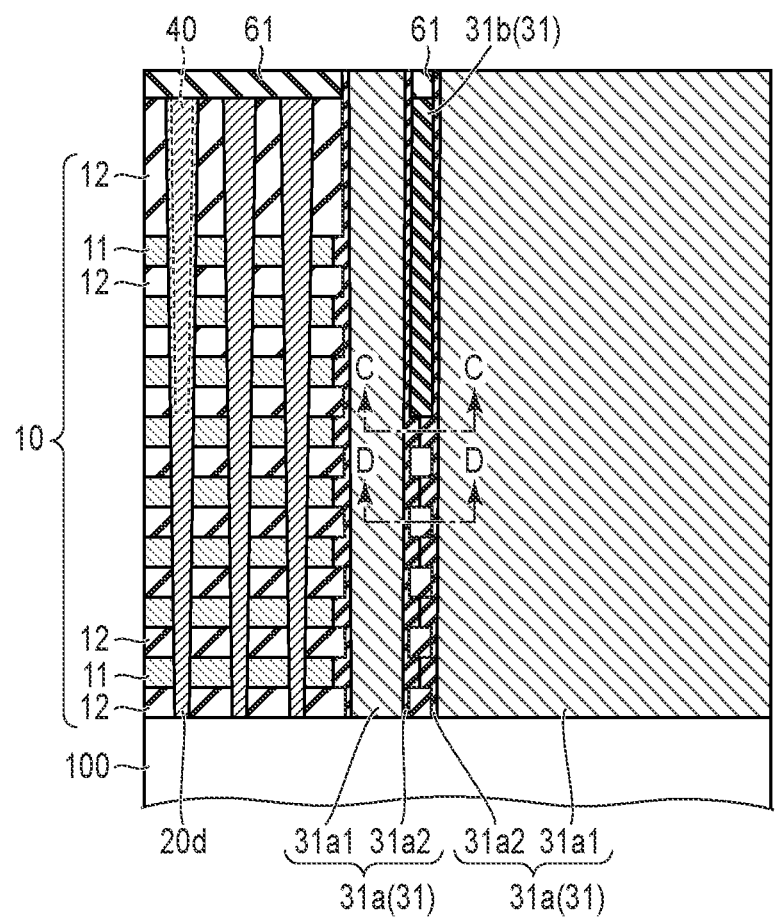
F I G. 14B

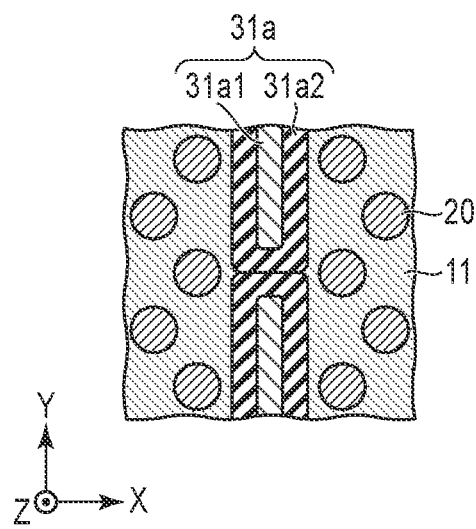
F I G. 14C
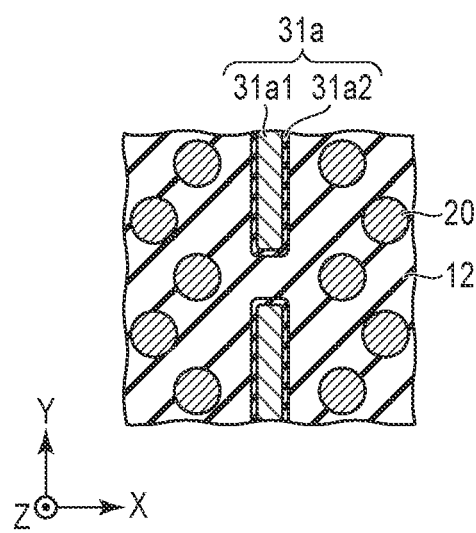
F I G. 14D

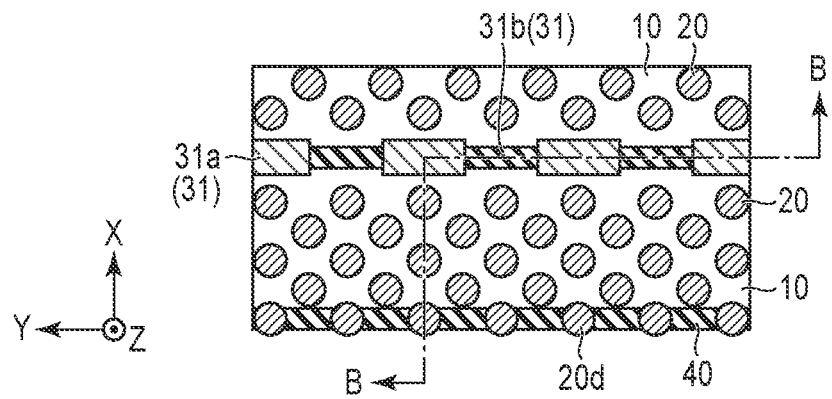
F I G. 15A
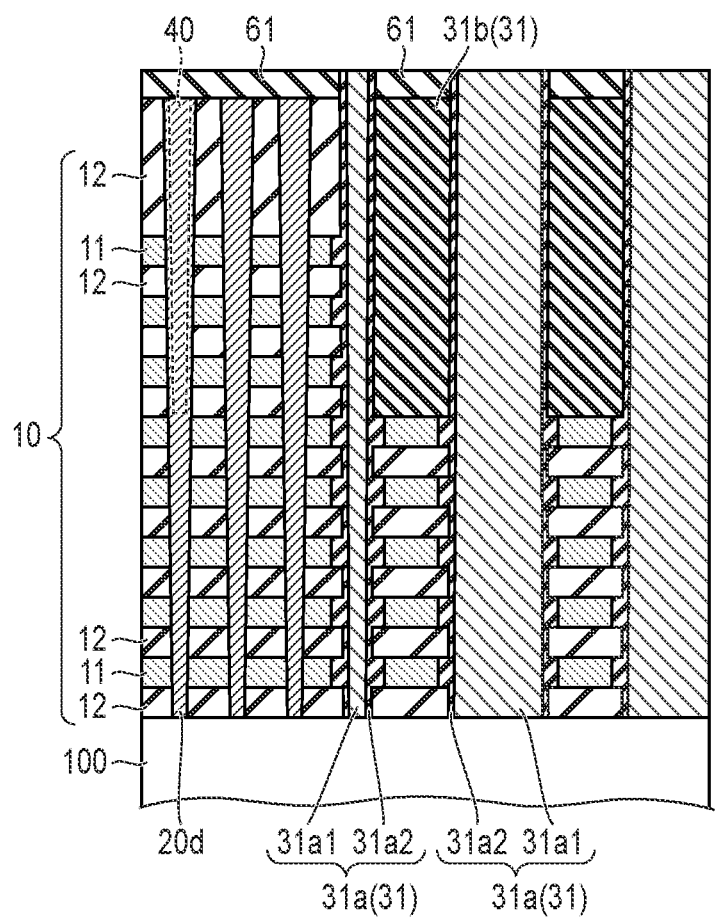
F I G. 15B

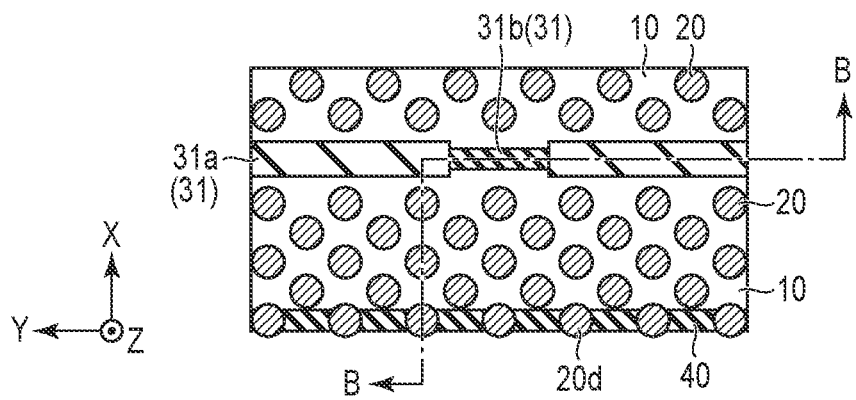
F I G. 16A
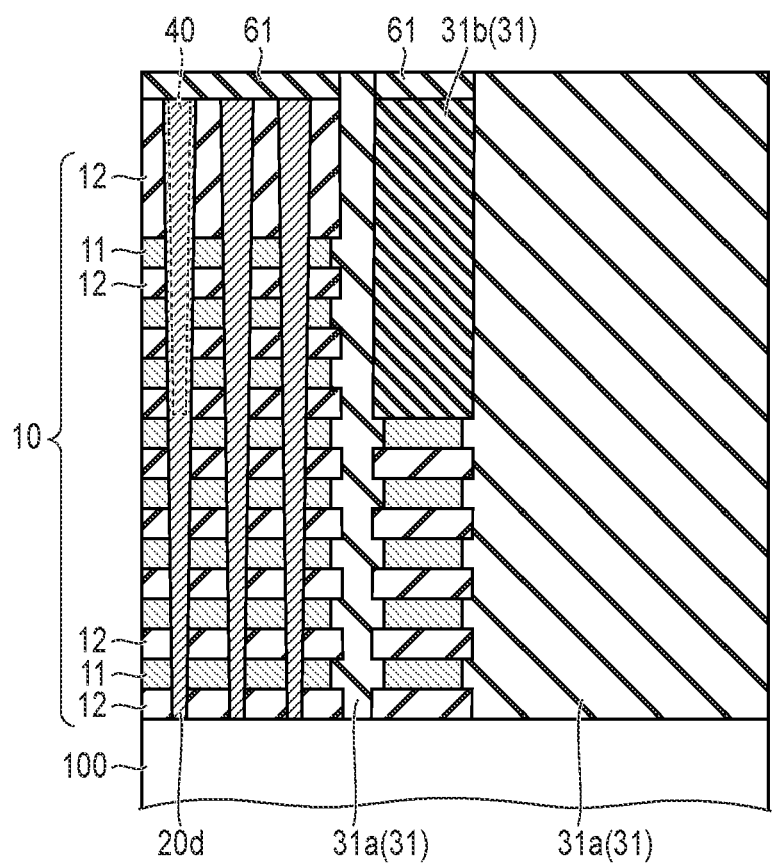
F I G. 16B

SEMICONDUCTOR MEMORY DEVICE

CROSS-REFERENCE TO RELATED APPLICATIONS

This application is based upon and claims the benefit of priority from Japanese Patent Application No. 2020-157519, filed Sep. 18, 2020, the entire contents of which are incorporated herein by reference.

FIELD

Embodiments described herein relate generally to a semiconductor memory device.

BACKGROUND

In a three-dimensional nonvolatile memory in which a plurality of memory cells are stacked on a semiconductor substrate, stabilization of the structure is important.

BRIEF DESCRIPTION OF THE DRAWINGS

FIG. 4A, FIG. 5A, FIG. 6A, FIG. 7A, FIG. 8A, and FIG. 9A are plane pattern views schematically showing parts of a semiconductor memory device manufacturing method according to the embodiment.

FIG. 4B, FIG. 5B, FIG. 6B, FIG. 7B, FIG. 8B, and FIG. 9B are cross-sectional views schematically showing parts of a semiconductor memory device manufacturing method according to the embodiment.

FIG. 14A is a view schematically illustrating the plane pattern of a first modified example of the semiconductor memory device according to the embodiment.

FIG. 14B is a cross-sectional view schematically illustrating the first modified example of the semiconductor memory device according to the embodiment.

FIG. 14C is a cross-sectional view schematically illustrating the first modified example of the semiconductor memory device according to the embodiment.

FIG. 14D is a cross-sectional view schematically illustrating the first modified example of the semiconductor memory device according to the embodiment.

FIG. 15A is a view schematically illustrating the plain pattern of a second modified example of the semiconductor memory device according to the embodiment.

FIG. 15B is a cross-sectional view schematically illustrating the second modified example of the semiconductor memory device according to the embodiment.

FIG. 16A is a view schematically illustrating the plain pattern of a third modified example of the semiconductor memory device according to the embodiment.

FIG. 16B is a cross-sectional view schematically illustrating the third modified example of the semiconductor memory device according to the embodiment.

DETAILED DESCRIPTION

In general, according to one embodiment, a semiconductor memory device includes: a stacked layer body including a structure in which a plurality of conductive layers and a plurality of insulating layers are alternately stacked in a first direction; a plurality of pillar structures each including a semiconductor layer extending in the first direction through the stacked layer body; a plurality of partition structures each extending in the first direction and a second direction intersecting the first direction in the stacked layer body, and partitioning the plurality of pillar structures into a plurality of groups in a third direction intersecting the first and second directions; and an intermediate structure provided between the partition structures adjacent to each other in the third direction, the intermediate structure extending in the first direction from an upper end of the stacked layer body and terminating at a position between the upper end and a lower end of the stacked layer body, wherein the partition structures include a first partition structure including at least two first portions and at least one second portion arranged in the second direction, the second portion being located between the first portions adjacent to each other in the second direction, each of the first portions extends in the first direction from the upper end to the lower end of the stacked layer body, and the second portion extends in the first direction from the upper end of the stacked layer body and terminates at the position between the upper end and the lower end of the stacked layer body.

One of embodiments will be described hereinafter with reference to the accompanying drawings.

First, a basic configuration of a semiconductor memory device (NAND type nonvolatile semiconductor memory device) according to the embodiment will be described.

Figure 1A:
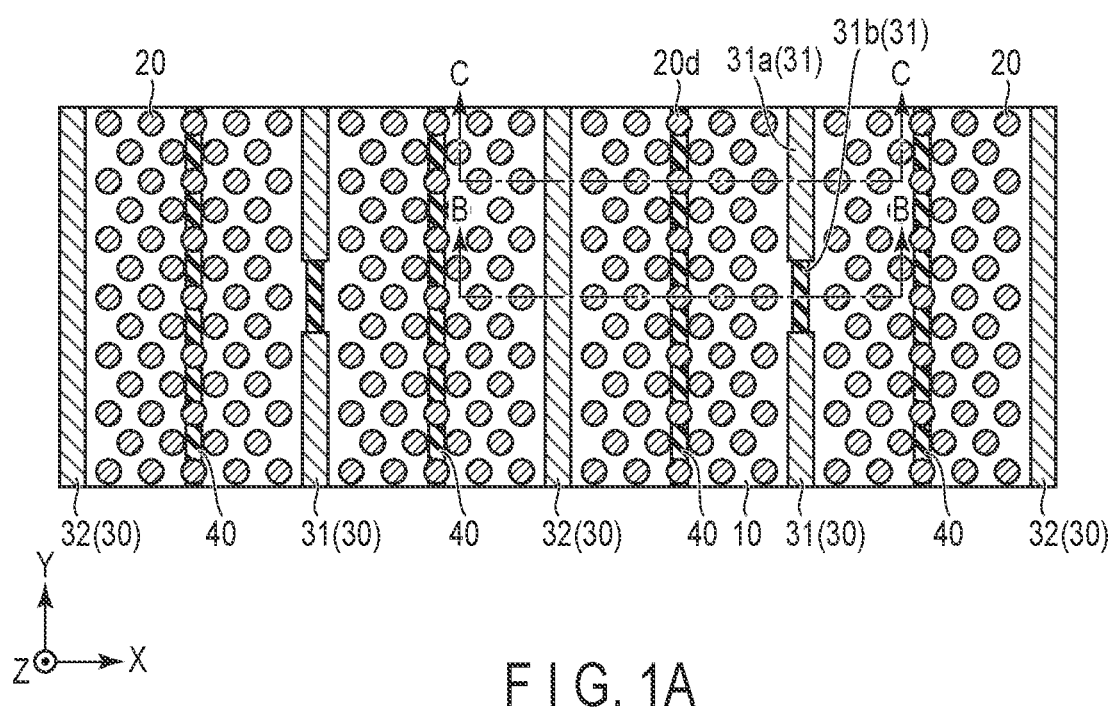
FIG. 1A is a view schematically illustrating a plane pattern of a basic configuration of a semiconductor memory device according to the embodiment.
Figure 1B:
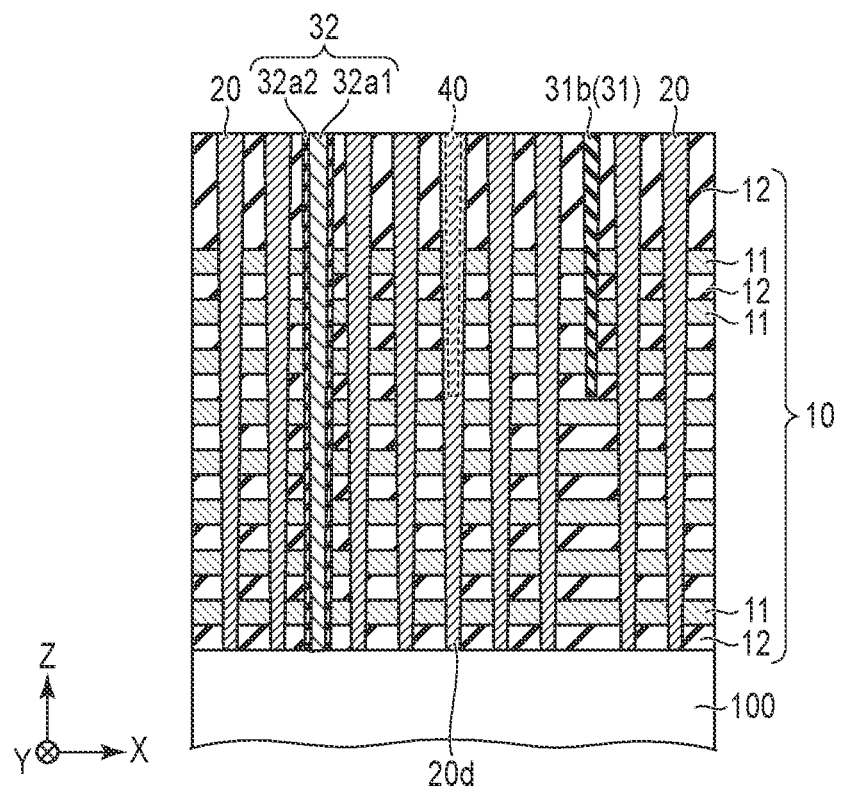
FIG. 1B is a cross-sectional view schematically illustrating the basic configuration of the semiconductor memory device according to the embodiment.
Figure 1C:
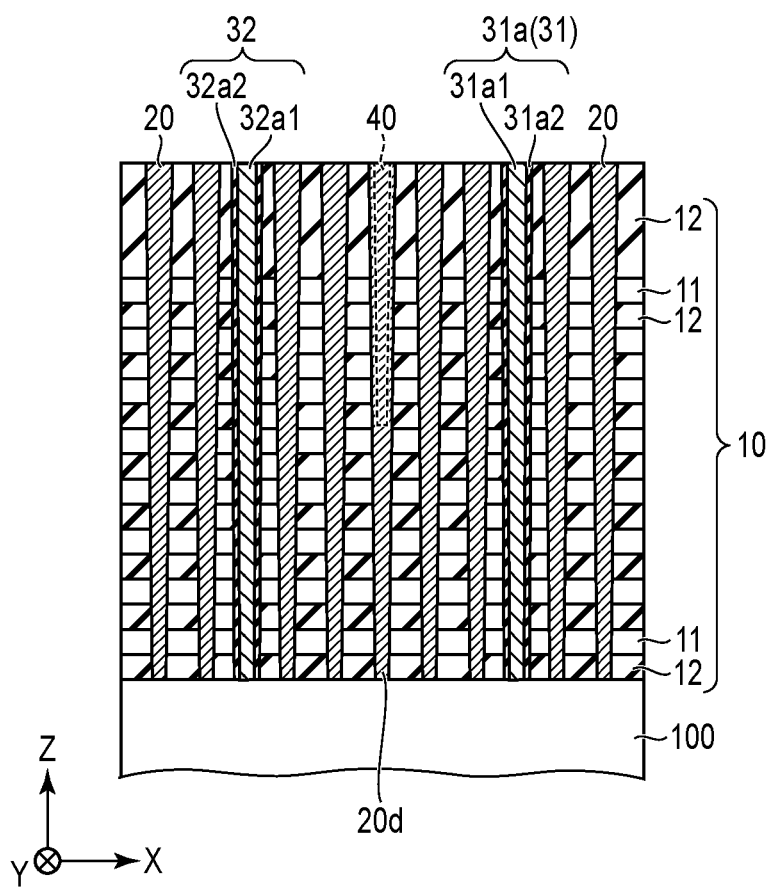
FIG. 1C is a cross-sectional view schematically illustrating the basic configuration of the semiconductor memory device according to the embodiment.
Figure 2:
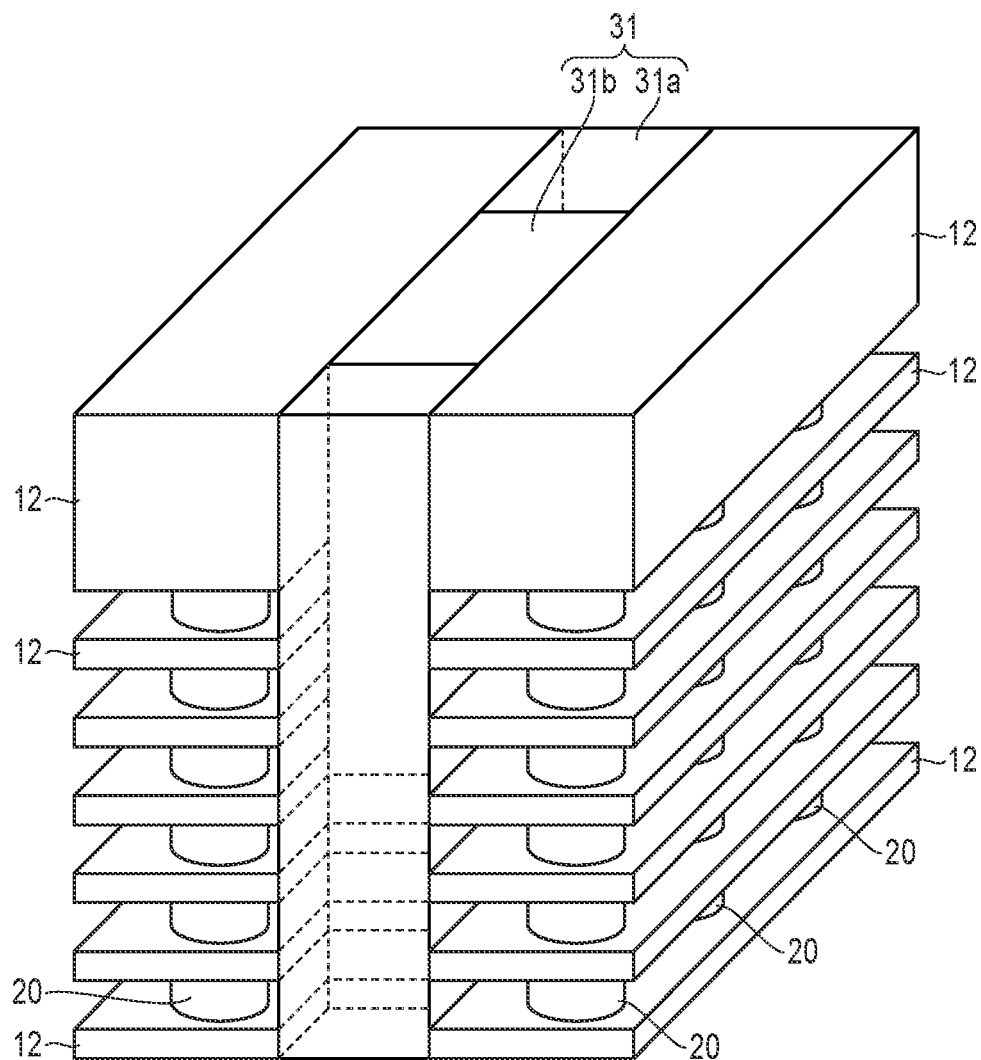
FIG. 2 is a perspective view schematically illustrating part of the configuration of the semiconductor memory device according to the embodiment.

FIG. 1A schematically illustrates a plane pattern of a basic configuration of the semiconductor memory device according to the present embodiment. FIG. 1B and FIG. 1C are cross-sectional views taken along line B-B and line C-C in FIG. 1A. FIG. 2 is a perspective view schematically illustrating part of the configuration of the semiconductor memory device according to the present embodiment. In FIG. 2, however, conductive layers 11 are not illustrated to enable the illustration to be easily viewed. Incidentally, an X direction (third direction), a Y direction (second direction), and a Z direction (first direction) are the directions orthogonal to each other.

The semiconductor memory device according to the present embodiment comprises a stacked layer body 10, a plurality of pillar structures 20, a plurality of partition structures 30, and a plurality of intermediate structures 40. The stacked layer body 10, the pillar structures 20, the partition structures 30, and the intermediate structures 40 are provided above a semiconductor substrate 100.

The stacked layer body 10 has a structure in which a plurality of conductive layers 11 and a plurality of insulating layers 12 are stacked alternately in the Z direction. Incidentally, in fact, a large number of conductive layers 11 and insulating layers 12 are stacked, and the number of the stacked conductive layers 11 and insulating layers 12 is more than the number illustrated in the drawings. The conductive layers 11 are formed of a metallic material such as tungsten (W) and the insulating layers 12 are formed of an insulating material such as a silicon oxide. The conductive layers 11 and the insulating layers 12 are provided parallel to an XY plane perpendicular to the Z direction. The conductive layers 11 comprise a function of an electrode layer, more specifically, a word line or a select gate line for a NAND string. The insulating layers 12 comprise a function of insulating the adjacent conductive layers 11 from each other.

Each of the pillar structures 20 extends in the Z direction through the stacked layer body 10, includes a semiconductor layer extending in the Z direction and a charge storage layer surrounding a side surface of the semiconductor layer, forms a memory cell at each part intersecting the word line, and forms a select transistor at each part intersecting the select gate line.

Figure 3A:
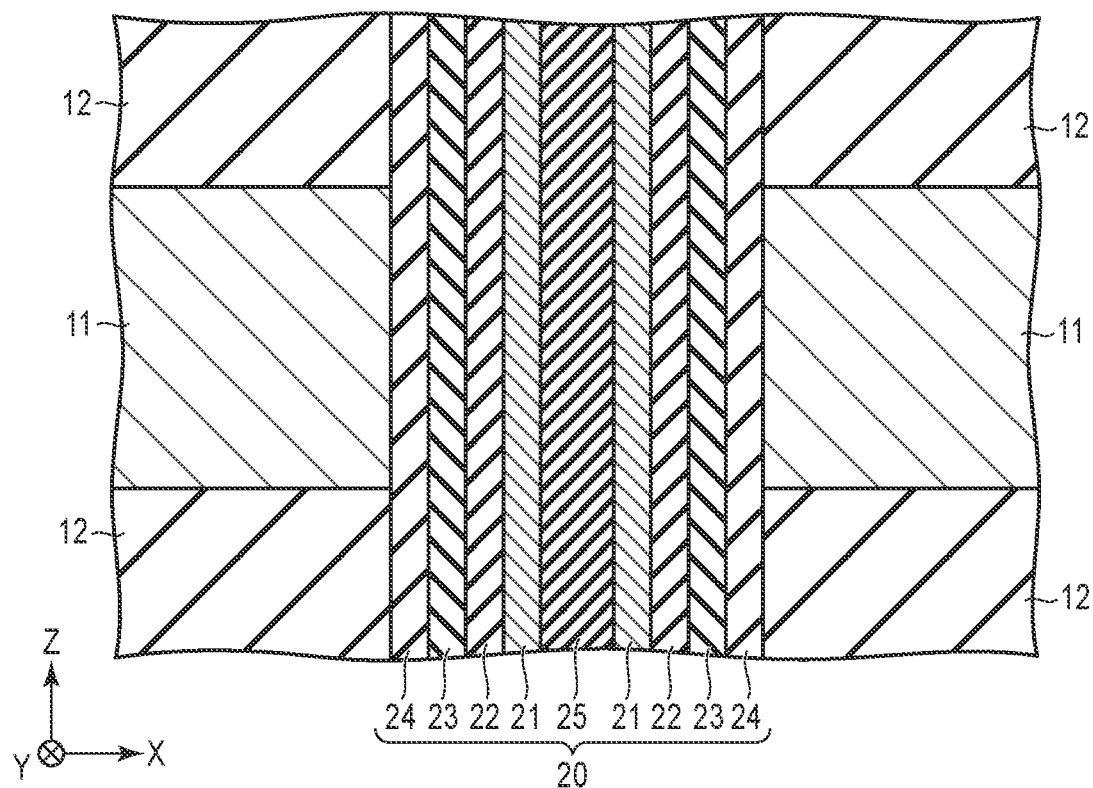
FIG. 3A is a cross-sectional view schematically illustrating a detailed configuration of a memory cell unit of the semiconductor memory device according to the embodiment.
Figure 3B:
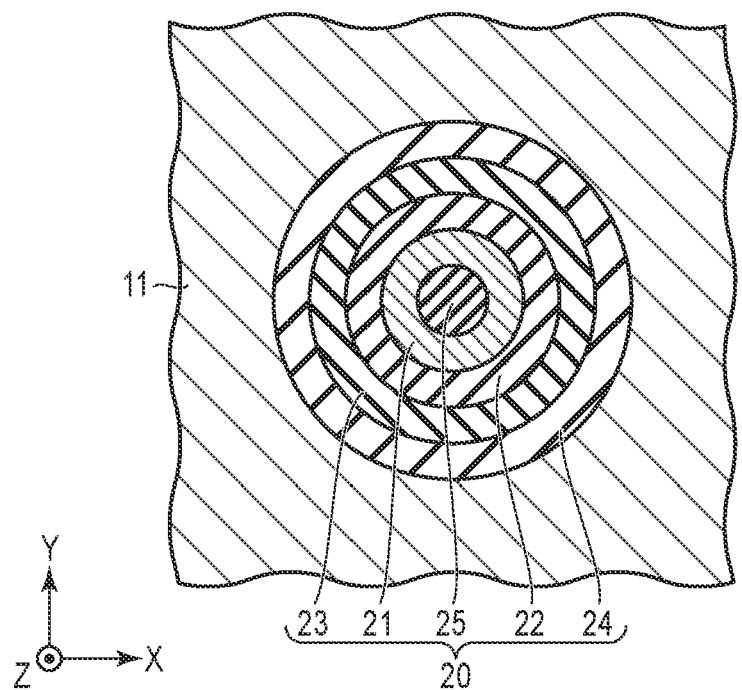
FIG. 3B is a cross-sectional view schematically illustrating a detailed configuration of the memory cell unit of the semiconductor memory device according to the embodiment.

Each of FIG. 3A and FIG. 3B is a cross-sectional view schematically illustrating detailed configuration of the memory cell unit configured by the conductive layer 11 and the pillar structure 20. FIG. 3A is a cross-sectional view taken in a direction parallel to the Z direction, and FIG. 3B is a cross-sectional view taken in a direction perpendicular to the Z direction.

The pillar structure 20 includes a semiconductor layer 21, a tunnel insulating layer 22, a charge storage layer 23, a block insulating layer 24, and a core insulating layer 25. Each of the semiconductor layer 21, the tunnel insulating layer 22, the charge storage layer 23, and the block insulating layer 24 has a cylindrical shape, and the core insulating layer 25 has a columnar shape. More specifically, the semiconductor layer 21 surrounds a side surface of the core insulating layer 25, the tunnel insulating layer 22 surrounds a side surface of the semiconductor layer 21, the charge storage layer 23 surrounds a side surface of the tunnel insulating layer 22, and the block insulating layer 24 surrounds a side surface of the charge storage layer 23. For example, the semiconductor layer 21 is formed of silicon, the tunnel insulating layer 22 is formed of silicon oxide, the charge storage layer 23 is formed of silicon nitride, the block insulating layer 24 is formed of silicon oxide, and the core insulating layer 25 is formed of silicon oxide.

The conductive layer 11 surrounding the pillar structure 20 functions as a gate electrode, and a memory cell is configured by a part functioning as the gate electrode of the conductive layer 11 and a part surrounded by the conductive layer 11 of the pillar structure 20.

An upper select transistor portion (drain side select transistor portion) and a lower select transistor portion (source side select transistor portion) for selecting the memory cell unit are provided on an upper layer side and a lower layer side of the memory cell unit, respectively. The basic configurations of these select transistor portions are also similar to the configuration of the memory cell unit illustrated in FIG. 3A and FIG. 3B. In the select transistor portions, all of the tunnel insulating layer 22, the charge storage layer 23, and the block insulating layer 24 function as a gate insulating layer.

Each partition structure 30 extends in the Z direction and the Y direction in the stacked layer body 10, and the pillar structures 20 are partitioned into a plurality of groups in the X direction by the plurality of partition structures 30. The partition structures 30 are arranged in the X direction at approximately regular intervals, and the number of columns of the pillar structures 20 arranged between the adjacent partition structures 30 is constant. In the present embodiment, nine lines of pillar structures 20 including dummy pillar structures (pillar structures arranged at positions corresponding to the intermediate structures 40) to be described below are arranged between the adjacent partition structures 30.

The partition structure 30 includes a first partition structure 31 and a second partition structure 32. The first partition structure 31 and the second partition structure 32 are formed by burying a predetermined material in a slit used in a replacement process to be described below, except a second portion 31b of the first partition structure 31 to be described below. The first partition structures 31 and the second partition structures 32 are provided alternately in the X direction.

The first partition structure 31 includes a first portion 31a and a second portion 31b as described below.

Incidentally, in the example of FIG. 1A, two first portions 31a and one second portion 31b in one first partition structure 31 are illustrated, but a plurality of first portions 31a and a plurality of second portions 31b may be provided alternately in the Y direction in the first partition structure 31. In general, the first partition structure 31 includes at least two first portions 31a and at least one second portion 31b arranged in the Y direction, and the second portion 31b is located between the first portions 31a adjacent in the Y direction. In addition, in the Y direction, the total length of the at least two first portions 31a is longer than the total length of the at least one second portion 31b.

As illustrated in FIG. 1G, the first portion 31a extends from an upper end to a lower end of the stacked layer body 10 in the Z direction. Therefore, in the region where the first portion 31a is provided, the stacked layer body 10 is divided from the upper end to the lower end in the X direction. The first portion 31a includes a conductive portion 31a1 and an insulating portion 31a2. The conductive portion 31a1 extends from the upper end to the lower end of the stacked layer body 10, and the lower end of the conductive portion 31a1 is connected to a common source region of the semiconductor substrate 100. The insulating portion 31a2 intervenes between the conductive portion 31a1 and the stacked layer body 10, and the conductive portion 31a1 is electrically isolated from the conductive layers 11 of the stacked layer body 10 by the insulating portion 31a2.

The second portion 31b is provided adjacent to the first portions 31a. More specifically, the second portion 31b is provided between the first portions 31a. As illustrated in FIG. 1B, the second portion 31b extends from the upper end of the stacked layer body 10 to a predetermined position between the upper end and the lower end of the stacked layer body 10, in the Z direction, and is formed of an insulating portion extending to the predetermined position. Therefore, in the region where the second portion 31b is provided, the stacked layer body 10 is divided from the upper end to the predetermined position in the X direction. More specifically, the second portion 31b extending in the Z direction from the upper end of the stacked layer body 10 terminates at the predetermined position and divides a predetermined number of conductive layers 11 (in the example illustrated, three conductive layers 11) in the X direction. The predetermined number of the conductive layers 11 are used as gate electrodes of the upper select transistor portion of the NAND string.

As illustrated in FIG. 1B and FIG. 1C, the second partition structure 32 has a structure that the whole body extends from the upper end to the lower end of the stacked layer body 10 in the Z direction. Therefore, in the region where the second partition structure 32 is provided, the stacked layer body 10 is divided from the upper end to the lower end in the X direction. The second partition structure 32 includes a conductive portion 32a1 and an insulating portion 32a2. The conductive portion 32a1 extends from the upper end to the lower end of the stacked layer body 10, and the lower end of the conductive portion 32a1 is connected to a common source region of the semiconductor substrate 100. The insulating portion 32a2 intervenes between the conductive portion 32a1 and the stacked layer body 10, and the conductive portion 32a1 is electrically isolated from the conductive layers 11 of the stacked layer body 10 by the insulating portion 32a2.

The intermediate structure 40 is provided between the partition structures 30 adjacent in the X direction. More specifically, the intermediate structure 40 is provided at an approximately central position of the partition structures 30 adjacent in the X direction and is provided between the first partition structure 31 and the second partition structure 32 adjacent in the X direction. In addition, the intermediate structure 40 is provided at a position corresponding to a column of a dummy pillar structure 20d which does not function as a memory cell. That is, the intermediate structure 40 is provided at the position corresponding to the central column of the pillar structure 20.

The intermediate structure 40 extends in the Z direction and the Y direction in the stacked layer body 10. More specifically, the intermediate structure 40 has a structure that an insulating portion extends in the Z direction from the upper end of the stacked layer body 10 and terminates at the predetermined position between the upper end and the lower end of the stacked layer body 10. Therefore, the stacked layer body 10 is divided from the upper end to the predetermined position in the X direction, in the region where the intermediate structure 40 is provided. More specifically, the intermediate structure 40 divides a predetermined number of conductive layers 11 (in the example illustrated, three conductive layers 11) in the X direction. The predetermined number of conductive layers 11 are used as gate electrodes of the upper select transistor portion.

The intermediate structure 40 is formed in the same processes as the second portion 31b of the first partition structure 31. Therefore, the material of the intermediate structure 40 is the same as the material of the second portion 31b of the first partition structure 31. In addition, the positions in the height direction (Z direction) of the upper end and the lower end of the intermediate structure 40 correspond to the position in the height direction (Z direction) of the second portion 31b of the first partition structure 31, and the number of the conductive layers 11 divided by the intermediate structure 40 is the same as the number of the conductive layers 11 divided by the second portion 31b of the first partition structure 31.

In addition, the line width (width in the X direction) of the intermediate structure 40 is substantially the same as the line width of the second portion 31b of the first partition structure 31 and is smaller than the line width of the first portion 31a of the first partition structure 31 and the line width of the second partition structure 32. Therefore, the occupation area (occupation area in the X direction) of the intermediate structure 40 is smaller than the occupation area (occupation area in the X direction) of the first partition structure 31 and the second partition structure 32.

Incidentally, the positions in the height direction (Z direction) of the upper ends of the first partition structure 31 (first portion 31a and second portion 31b), the second partition structure 32 and the intermediate structure 40 may be aligned as illustrated in the example of FIG. 1B and FIG. 1C or all the positions may not be aligned. For example, the positions of the upper ends of the first portion 31a and the second portion 31b of the first partition structure 31 may be or may not be aligned with each other. Similarly, the positions of the upper ends of the second portion 31b of the first partition structure 31, the intermediate structure 40, and the second partition structure 32 may be or may not be aligned with each other.

Next, functions of the above-described partition structure 30 and intermediate structure 40 will be described.

As described above, basically, the partition structure 30 is formed by filling a slit used for the replacement process to be described below with a predetermined material. The slit is used for removal of sacrificial layers and formation of the conductive layers 11 in the replacement process.

In addition, as described above, the first partition structures 31 and the second partition structures 32 are provided alternately in the X direction. One block is composed of the second partition structure 32, the first partition structure 31, and the second partition structure 32 continuous in the X direction. In the same block, each of the conductive layers 11 included in the stacked layer body 10 is electrically connected commonly except the conductive layers 11 divided in the X direction by the second portion 31b of the first partition structure 31 and the intermediate structure 40. That is, in the same block, each conductive layer 11 functions as a common word line or a lower select gate line used as the gate electrode of the lower select transistor portion.

The intermediate structure 40 is provided at an approximately central position between the partition structures 30 adjacent in the X direction. That is, the intermediate structure 40 is provided at an approximately central position between the first partition structure 31 and the second partition structure 32. Therefore, in the present embodiment, the number of columns of the pillar structures 20 arranged between the intermediate structure 40 and the first partition structure 31 is the same as the number of columns (4 columns) of the pillar structures 20 arranged between the intermediate structure 40 and the second partition structure 32.

In addition, as described above, the intermediate structure 40 divides a predetermined number of conductive layers 11 (in the example illustrated, three conductive layer 11) in the X direction. As already described, the predetermined number of conductive layers 11 (three conductive layers 11) are used as the gate electrodes of the upper select transistor portion. Therefore, the gate electrodes of the select transistors located in the same layer are common between the intermediate structure 40 and the partition structure 30 adjacent to each other, and the predetermined number of conductive layers 11 function as the common upper select gate lines.

As described above, in the present embodiment, the first partition structure 31 includes the second portion 31b extending from the upper end of the stacked layer body 10 to the predetermined position between the upper end and the lower end of the stacked layer body 10. A semiconductor memory device having a stable structure can be thereby obtained. Particularly, a stable structure can be maintained in the replacement process to be described below. Descriptions will be added below.

As already described, the partition structure 30 is formed by filling the slit used for the replacement process with a predetermined material. The replacement process is a process to be executed when the stacked layer body 10 is formed. More specifically, the stacked layer body 10 is formed by alternately stacking insulating layers and sacrificial layers, then removing the sacrificial layers by etching through the slit to form cavities, and filling the cavities with the conductive layers. Therefore, in the stage of forming the cavities, the insulating layers 12 constructing the stacked layer body 10 are merely supported by the pillar structures 20 and are unstable.

In the present embodiment, the first partition structure 31 includes the first portion 31a and the second portion 31b. The first portion 31a extends from the upper end to the lower end of the stacked layer body 10, similarly to the second partition structure 32. For this reason, in a region corresponding to the first portion 31a, the slit is formed in the replacement process and functions effectively in the replacement process. The second portion 31b extends from the upper end of the stacked layer body 10 to the predetermined position between the upper end and the lower end of the stacked layer body 10. For this reason, the insulating layers 12 can be supported by the second portion 31b in the replacement process, and the stability of the structure can be improved. Therefore, according to the structure of the present embodiment, the stability of the structure can be achieved without disturbing the replacement process.

In addition, in the present embodiment, the line width (width in the X direction) of the intermediate structure 40 is smaller than the line width of the first portion 31a of the first partition structure 31 and the line width of the second partition structure 32, and the occupation area (occupation area in the X direction) of the intermediate structure 40 is smaller than the occupation area (occupation area in the X direction) of the first partition structure 31 and the second partition structure 32. If a portion having a large line width such as the first portion 31a of the first partition structure 31 is provided in the intermediate structure 40, the occupation area of the intermediate structure 40 is substantially prescribed by the portion having a large line width, and the overall area of the cell array region increases. In the present embodiment, the overall area of the cell array region can be reduced since the line width of the overall intermediate structure 40 is small.

In addition, in the present embodiment, the length of the Y directional total of first portion 31a including electrically conductive portion 31a1 is longer than the length of the Y directional total of second portion 31b. As already described, the conductive portion 31a1 of the first portion 31a extends from the upper end to the lower end of the stacked layer body 10 and is connected to the common source region of the semiconductor substrate 100. Therefore, the resistance in the Y direction can be lowered by making the length of the first portion 31a relatively longer, and the source line resistance can be reduced from the view point of the overall cell array region.

Next, a method of manufacturing the semiconductor memory device according to the present embodiment will be described with reference to FIG. 4A to FIG. 9A (plane pattern views) and FIG. 4B to FIG. 9B (cross-sectional views).

Figure 4A:
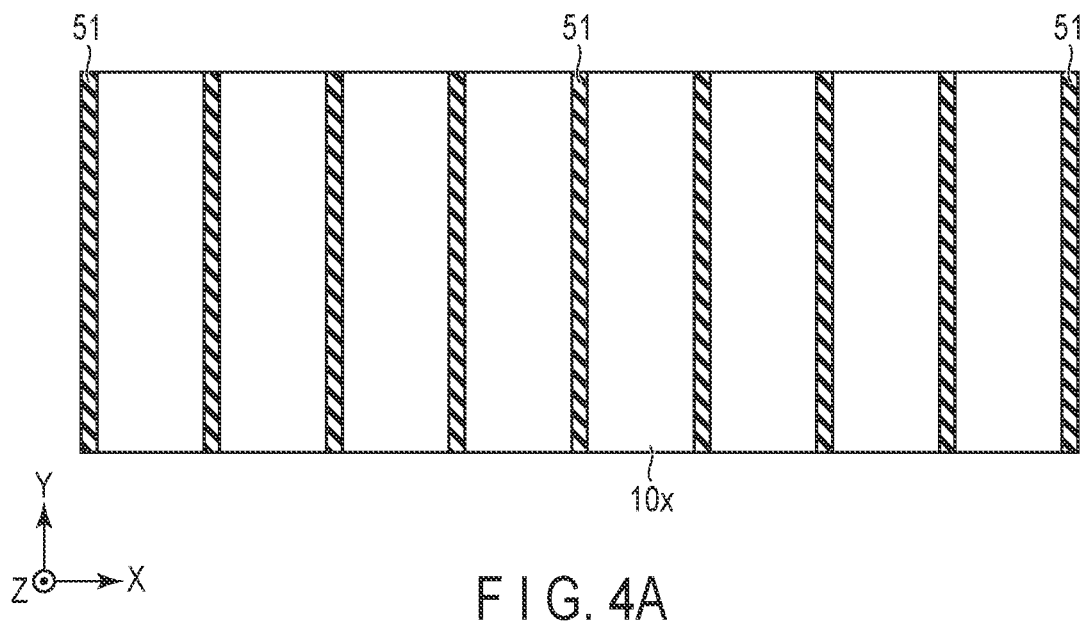
Figure 4B:
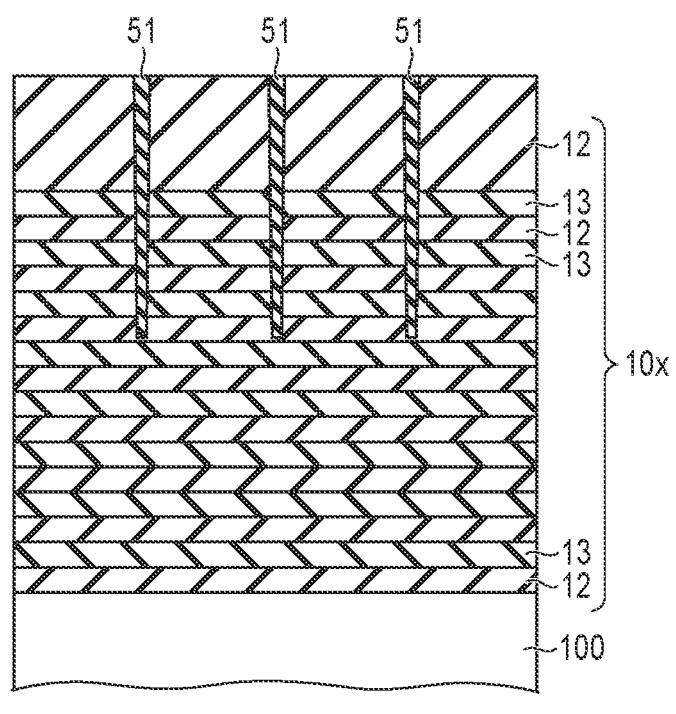

First, as illustrated in FIG. 4A and FIG. 4B, a stacked film 10x in which a plurality of insulating layers 12 and a plurality of sacrificial layers 13 are stacked alternately in the Z direction is formed on the semiconductor substrate 100. For example, the insulating layers 12 are formed of silicon oxide and the sacrificial layers 13 are formed of silicon nitride. Subsequently, in the stacked film 10x, slits are formed from an upper end of the stacked film 10x to a position corresponding to a height position of the lower end of the intermediate structure 40, and insulating structure portions 51 are formed by filling the slits with an insulator (for example, silicon oxide). The insulating structure portions 51 are formed at planar positions corresponding to the first partition structures 31, the second partition structures 32, and the intermediate structures 40.

Figure 5A:
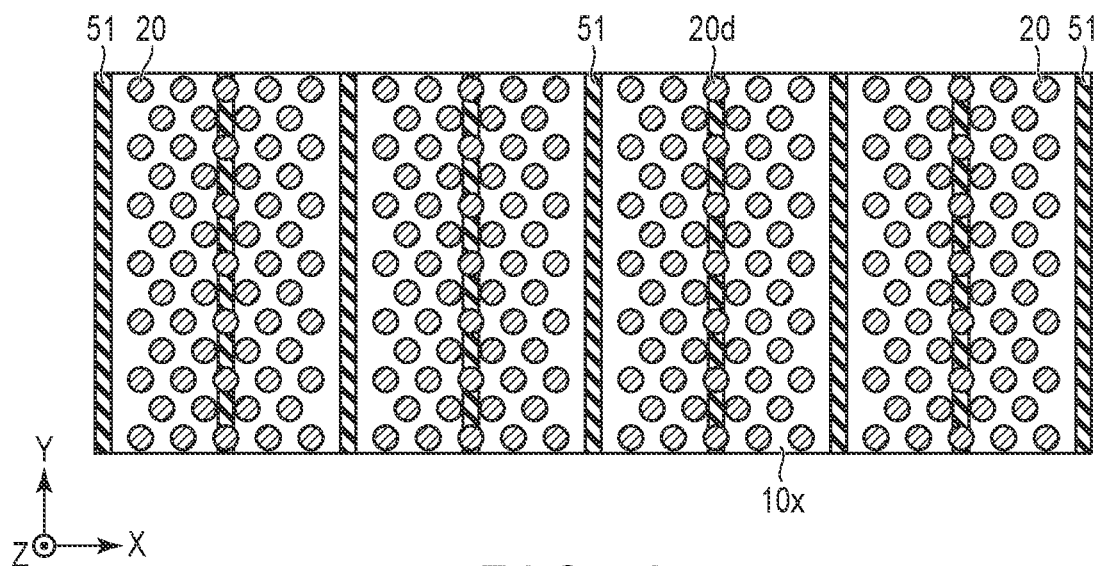
Figure 5B:
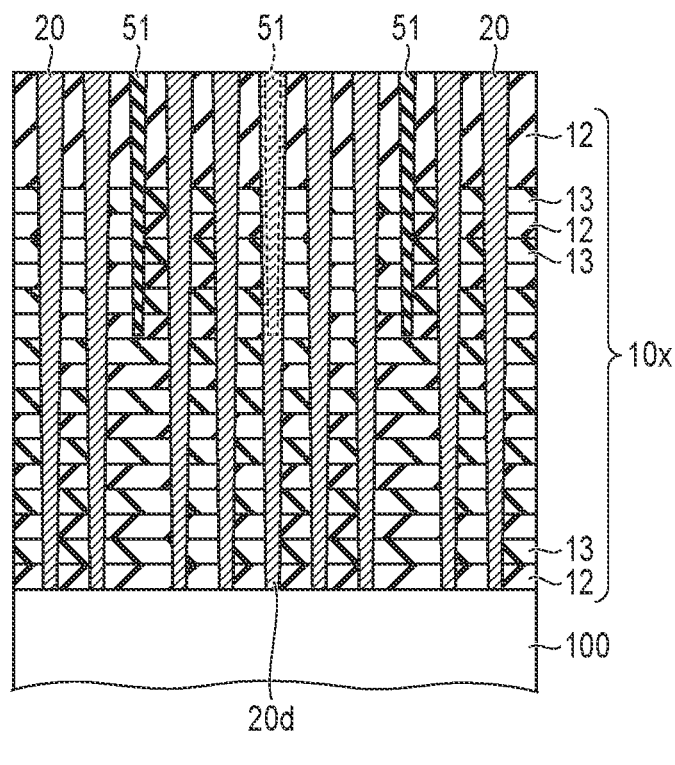

Then, as illustrated in FIG. 5A and FIG. 5B, memory holes are formed in the stacked film 10x, and pillar structures 20 are formed in the memory holes. The pillar structures 20 are also formed at positions corresponding to parts of the insulating structure portions 51 as dummy pillar structures 20d.

Figure 6A:
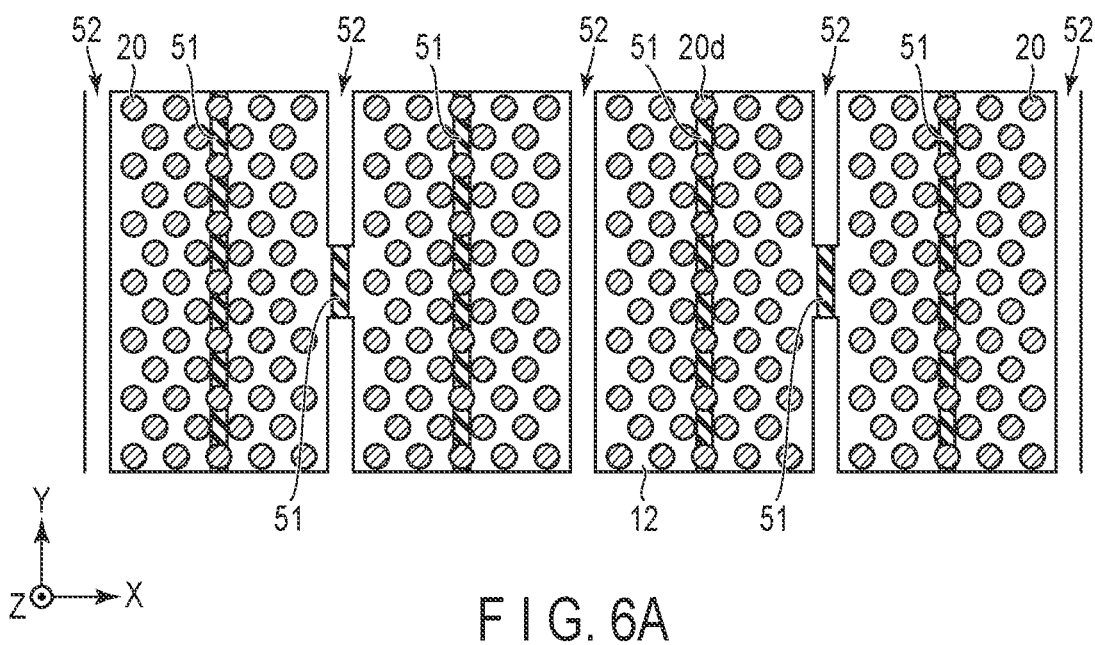
Figure 6B:
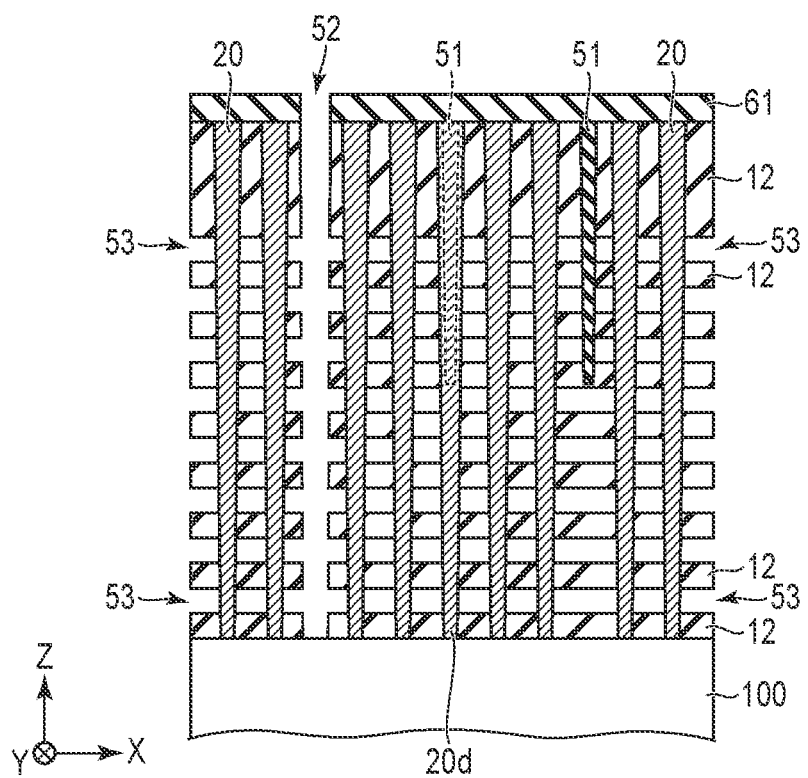

Next, as illustrated in FIG. 6A and FIG. 6B, an insulating layer 61 is formed on the entire surface and then slits 52 are formed in the stacked film 10x through the insulating layer 61. More specifically, the slits 52 are formed at positions corresponding to the first portions 31a of the first partition structures 31 and positions corresponding to the second partition structures 32. At this time, the slits 52 are not formed but the insulating structure portions 51 remain at the positions corresponding to the second portions 31b of the first partition structures 31. Furthermore, an etching solution is introduced through the slits 52 and the sacrificial layers 13 are etched selectively. Thus, cavities 53 are formed in the region where the sacrificial layers 13 are removed. As described above, the slits 52 are not formed but the insulating structure portions 51 remain at the positions corresponding to the second portions 31b of the first partition structures 31. For this reason, the stability of the structure can be improved even if the cavities 53 are formed.

Figure 7A:
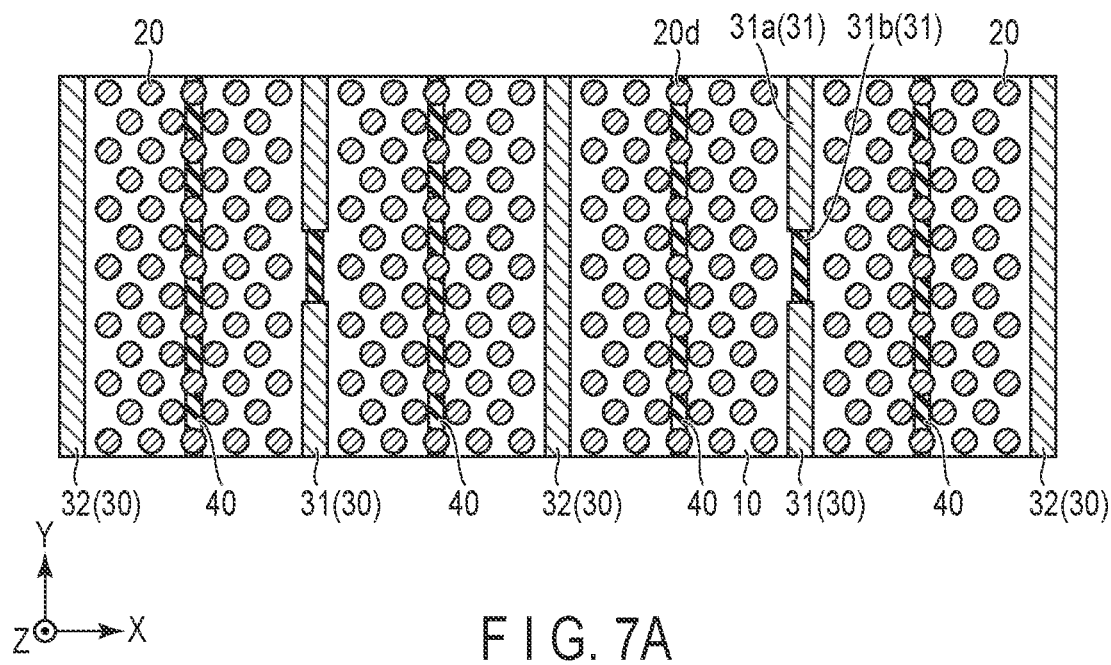
Figure 7B:
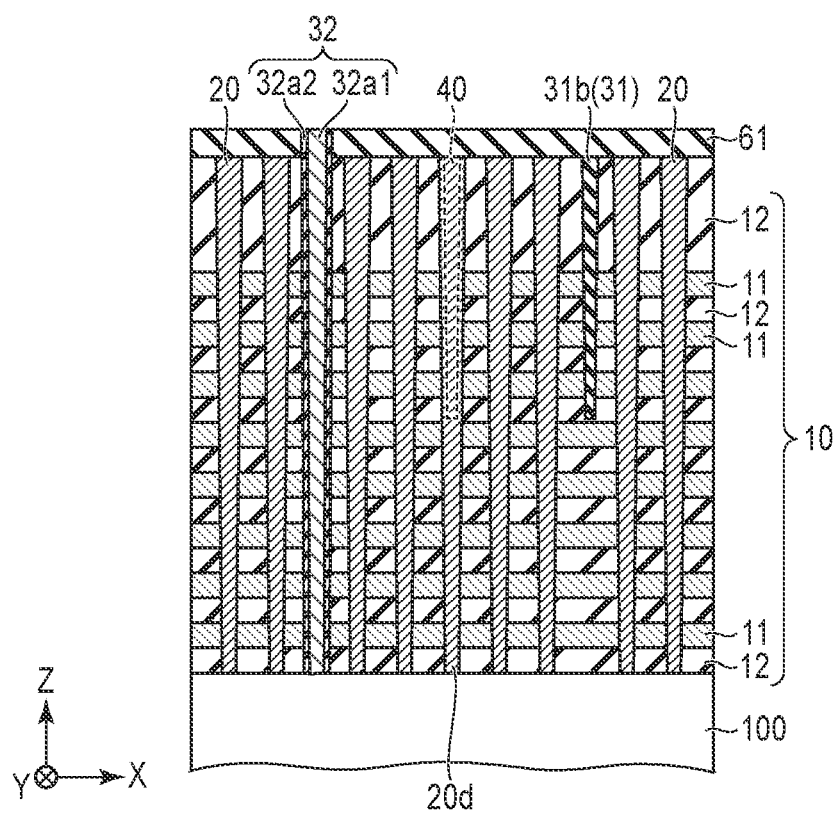

Next, as illustrated in FIG. 7A and FIG. 7B, the cavities 53 are filled with a metallic material such as tungsten (W) to form the conductive layers 11. Furthermore, the insulating portions 31a2 and 32a2 and the conductive portions 31a1 and 32a1 are formed in the slits 52. The conductive portions 31a1 and 32a1 are connected to the common source region of the semiconductor substrate 100 to provide a predetermined potential to the common source region of the semiconductor substrate 100. The first partition structures 31, the second partition structures 32, and the intermediate structures 40 can be thus obtained.

The semiconductor memory device comprising the basic configuration as illustrated in FIG. 1A, FIG. 1B, and FIG. 1C can be obtained in the above-described manners.

Figure 8A:
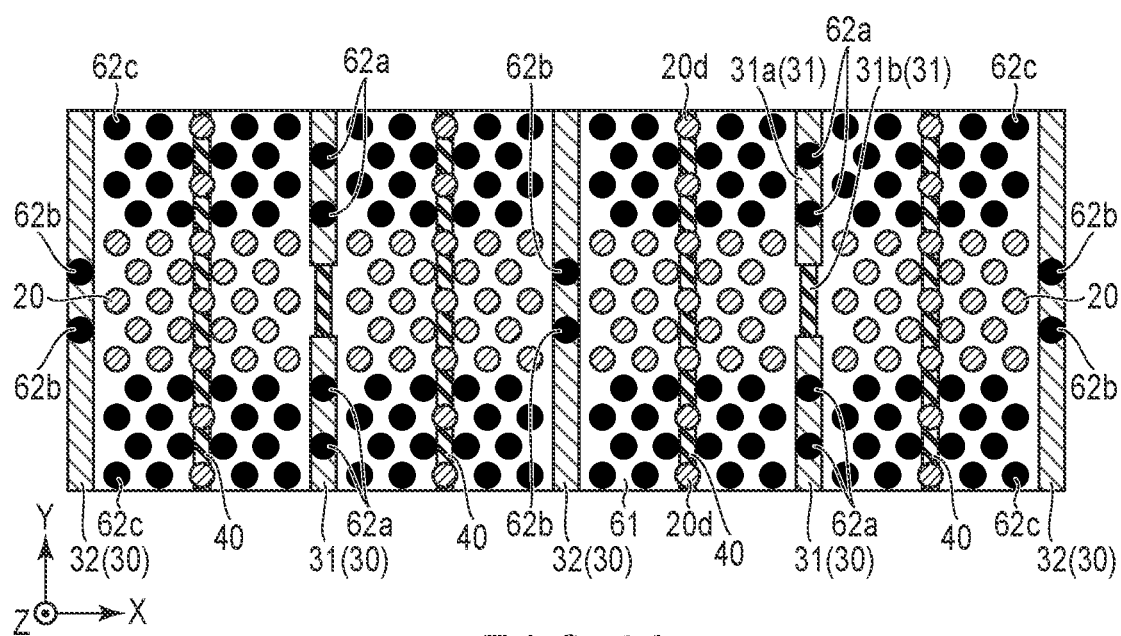
Figure 8B:
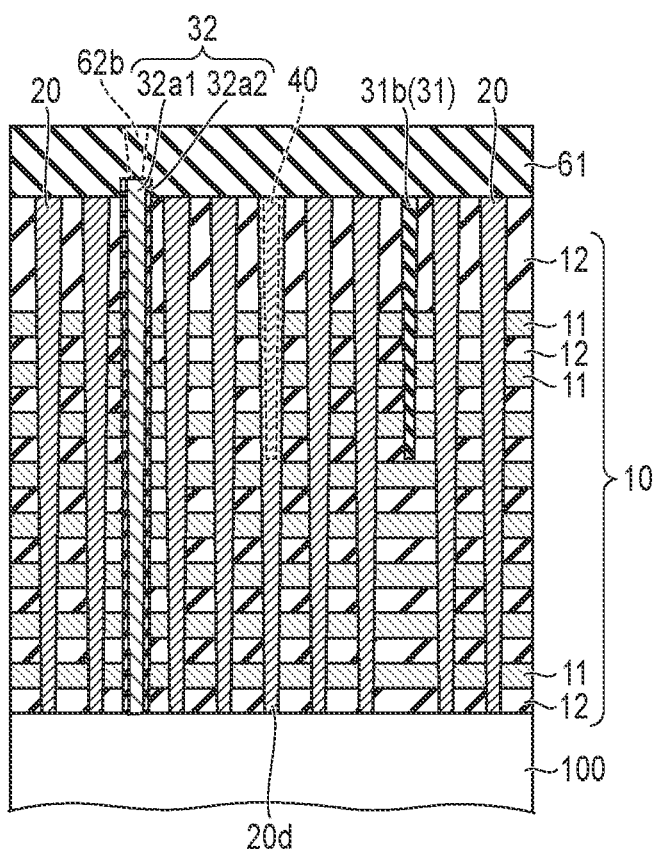

Next, as illustrated in FIG. 8A and FIG. 8B, the insulating layer 61 is further formed on the entire surface, and a plurality of plugs 62a, 62b, and 62c are formed in portions of the insulating layer 61 which have an increased thickness. The plugs 62a are connected to the first portions 31a of the first partition structures 31, and the plugs 62b are connected to the second partition structures 32. In addition, the plugs 62c are connected to the pillar structures 20. More specifically, the plugs 62c are connected to the drain of the upper select transistor.

Next, as illustrated in FIG. 9A and FIG. 9B, a wiring 63 for shunt is formed on the insulating layer 61, the plugs 62a, and the plugs 62b. That is, the wiring 63 for shunt is formed above the first partition structures 31, the second partition structures 32, and the intermediate structures 40. The plurality of plugs 62a and 62b are connected commonly by the wiring 63. As a result, the first portions 31a adjacent to each other in the Y direction of the first partition structure 31 are connected through the plugs 62a. In addition, the first portions 31a of the first partition structures 31 and the second partition structures 32 are also connected through the plugs 62a and 62b. Furthermore, the first portions 31a of the first partition structures 31 arranged in the X direction are also connected through the plugs 62a. Therefore, a predetermined potential can be supplied to the common source region of the semiconductor substrate 100 through the plugs 62a and 62b, the first portion 31a of the first partition structures 31, and the second partition structures 32, by supplying a predetermined potential to the wiring 63.

As described above, according to the manufacturing method of the present embodiment, the insulating structure portions 51 remain at the positions corresponding to the second portions 31b of the first partition structures 31 when the cavities 53 are formed in the processes of FIG. 6A and FIG. 6B, and the stability of the structure in the formation of the cavities 53 can be thereby improved.

In addition, in the present embodiment, the first portions 31a of the first partition structures 31 are formed in the process common to the process of the second partition structures 32, and the second portions 31b of the first partition structures 31 are formed in the process common to the intermediate structures 40. Therefore, the semiconductor memory device having the above-described advantages can be formed without adding a special process.

Figure 10:
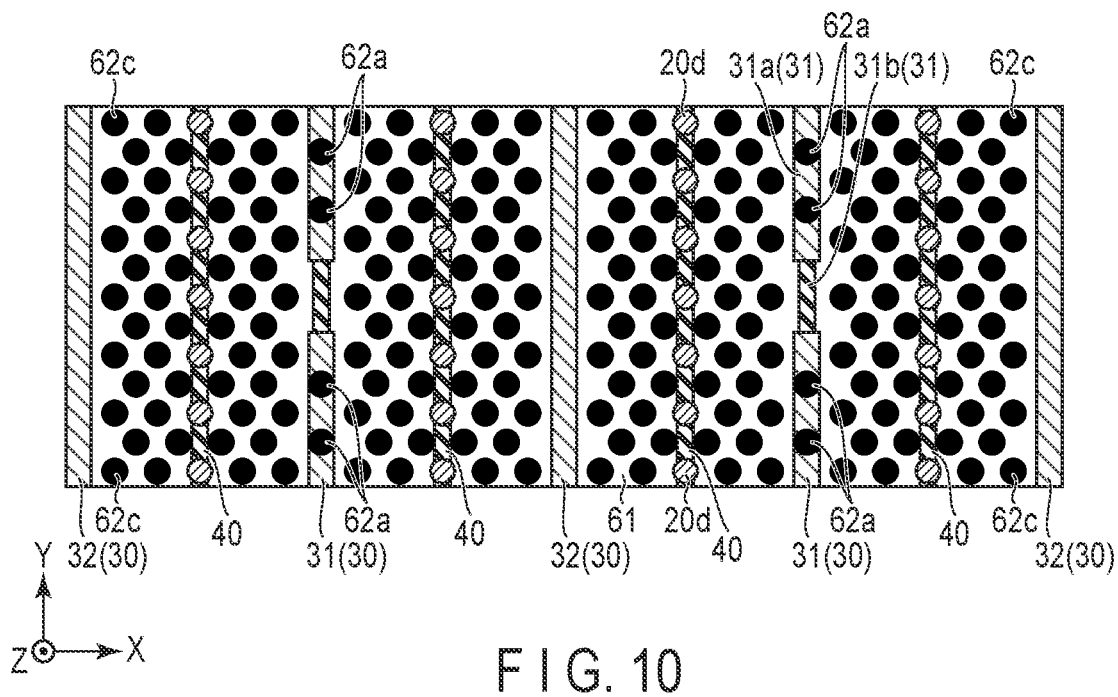
FIG. 10 is a plane pattern view schematically illustrating a part of the manufacturing method in a case where a wiring pattern for shunt is changed in the semiconductor memory device according to the embodiment.
Figure 11:
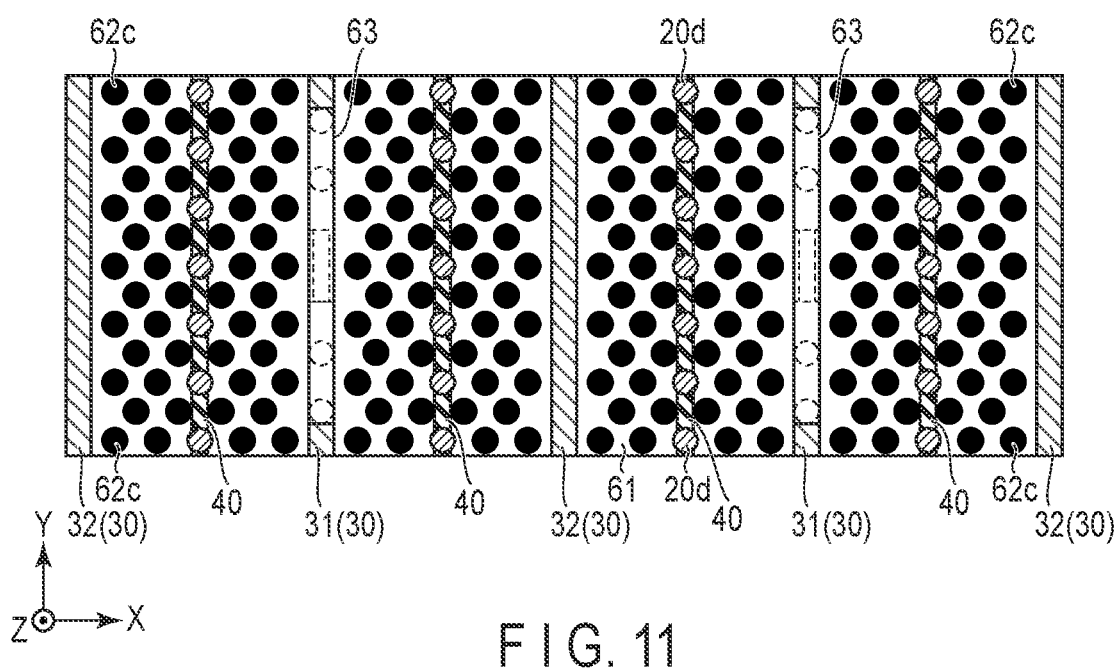
FIG. 11 is a plane pattern view schematically illustrating a part of the manufacturing method in a case where a wiring pattern for shunt is changed in the semiconductor memory device according to the embodiment.

FIG. 10 and FIG. 11 are planar pattern views schematically showing a method of manufacturing the semiconductor memory device in a case where the wiring for shunt is changed.

In the manufacturing method, an insulating layer 61 is formed on the entire surface in a process of FIG. 10, similarly to the process of FIG. 8A and FIG. 8B, after the process of FIG. 7A and FIG. 7B. Furthermore, a plurality of plugs 62a and 62c are formed in portions of the insulating layer 61 which are increased in thickness. The plugs 62a are connected to the first portions 31a of the first partition structures 31, and the plugs 62c are connected to the pillar structures 20.

Next, as illustrated in FIG. 11, the wirings 63 for shunt are formed on the insulating layer 61 and the plugs 62a. That is, the wirings 63 for shunt are formed along the first partition structures 31 above the first partition structures 31. The first portions 31a adjacent to each other in the Y direction, of the first partition structures 31, are connected through the plugs 62a, by the wirings 63. Therefore, a predetermined potential can be supplied to the common source region of the semiconductor substrate 100 through the plugs 62a and the first portions 31a of the first partition structures 31 by supplying a predetermined potential to the wirings 63.

Figure 12:
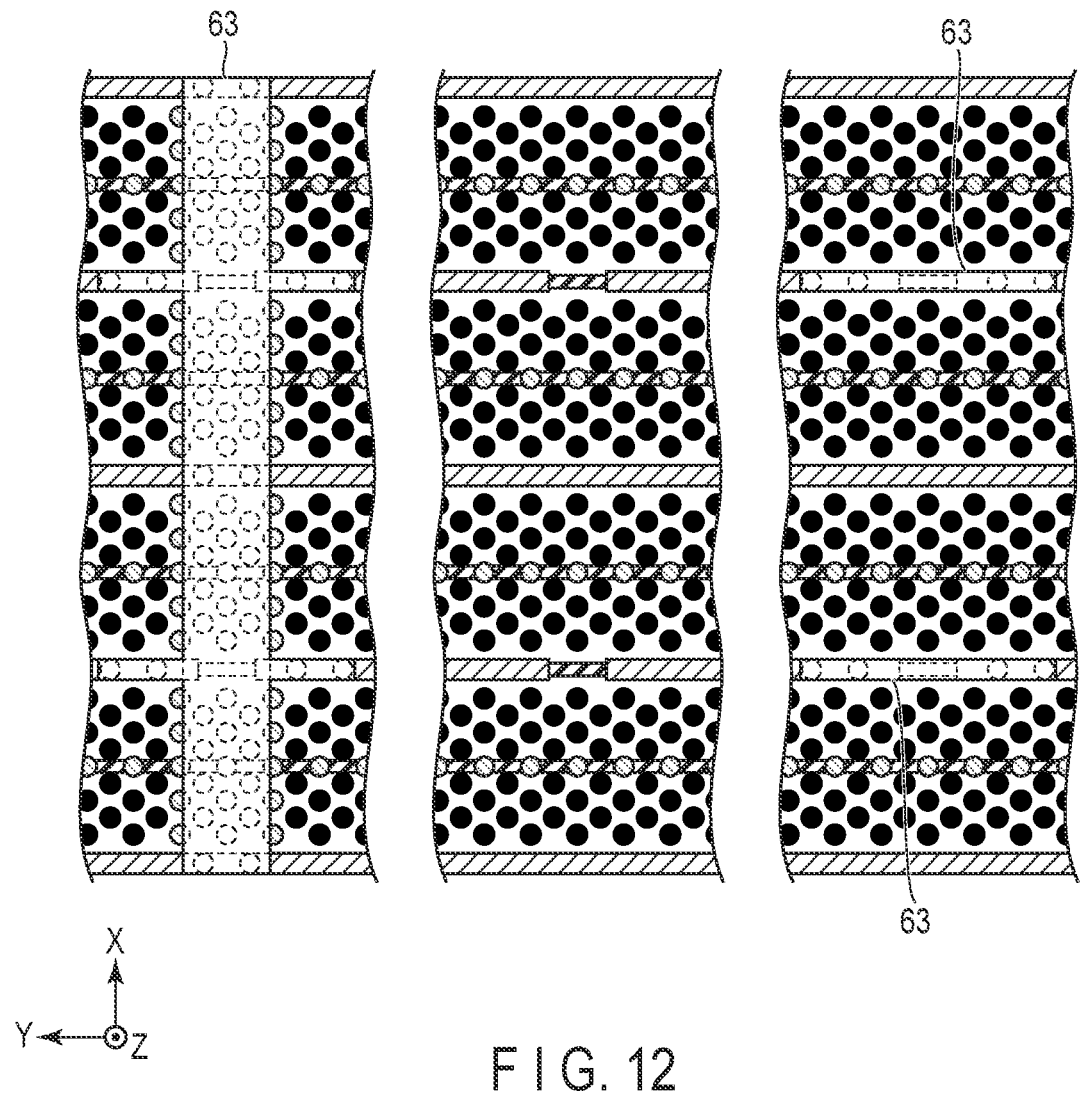
FIG. 12 is a plane pattern view schematically illustrating a configuration focusing the wiring for shunt in the semiconductor memory device according to the embodiment.

FIG. 12 is a planar pattern view schematically showing a planar configuration of the semiconductor memory device, focusing the wirings for shunt. As illustrated in FIG. 12, the region where the wirings 63 for shunt are provided as illustrated in FIG. 9A, the region where the wirings 63 for shunt are provided as illustrated in FIG. 11, and the region where the wirings 63 for shunt are not provided may exist together.

The first partition structure 31 becomes equivalent to the second partition structure 32, in view of the circuit, and such equivalent partition structures 30 are arranged at a small pitch in the X direction, by connecting first portions 31a adjacent to each other in the Y direction by the wirings 63 for shunt. In addition, as described above, the conductive portions 31a1 of the first portions 31a of the first partition structure 31 and the conductive portions 32a1 of the second partition structure 32 extend from the upper end to the lower end of the stacked layer body 10 and are connected to the common source region of the semiconductor substrate 100. Therefore, the source line resistance can be reduced from the viewpoint of the entire cell array region, by providing the above-described wirings 63 for shunt.

Furthermore, the configuration of the semiconductor memory device according to the present embodiment is illustrated in FIG. 13A, FIG. 13B, FIG. 13C, and FIG. 13D, and the semiconductor memory device according to a modified example of the present embodiment will be described while compared with FIG. 13A, FIG. 13B, FIG. 13C, and FIG. 13D.

Figure 13A:
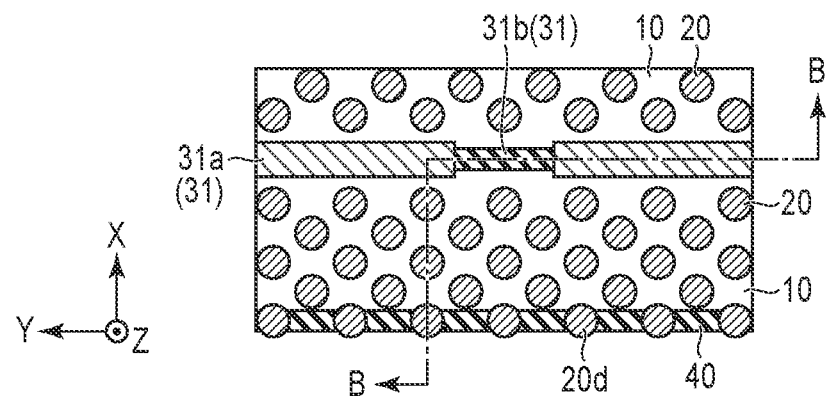
FIG. 13A is a view schematically illustrating the plane pattern of the semiconductor memory device according to the embodiment.
Figure 13B:
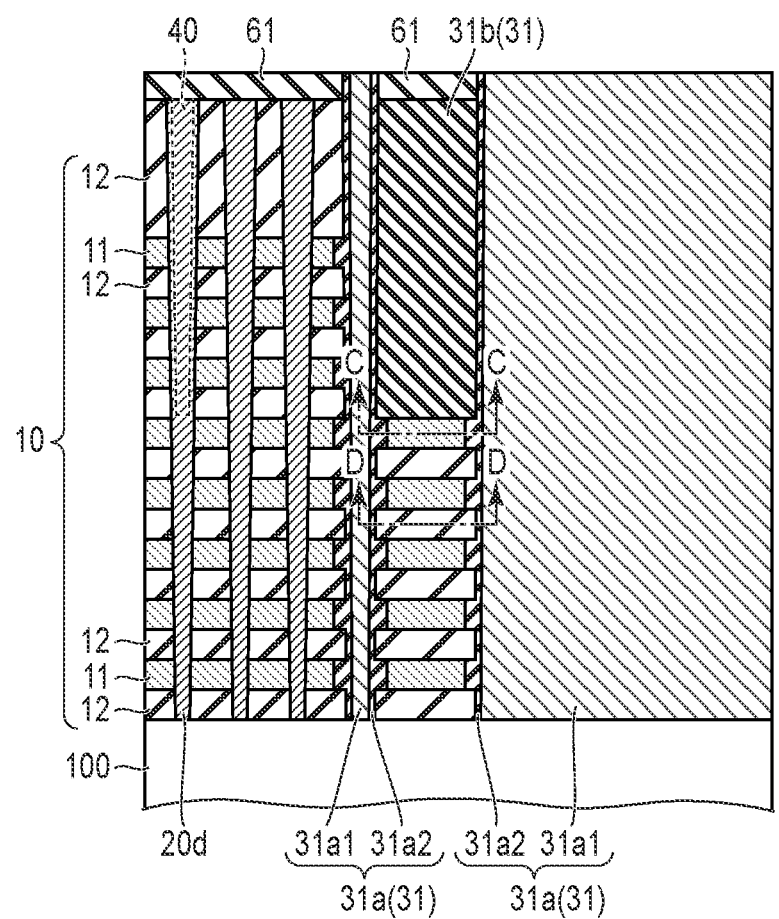
FIG. 13B is a cross-sectional view schematically illustrating the configuration of the semiconductor memory device according to the embodiment.
Figure 13C:
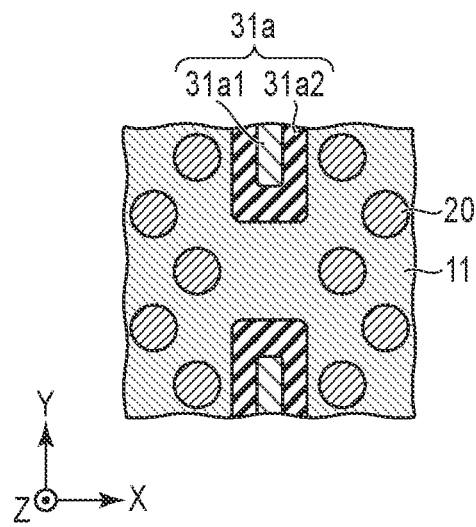
FIG. 13C is a cross-sectional view schematically illustrating the configuration of the semiconductor memory device according to the embodiment.
Figure 13D:
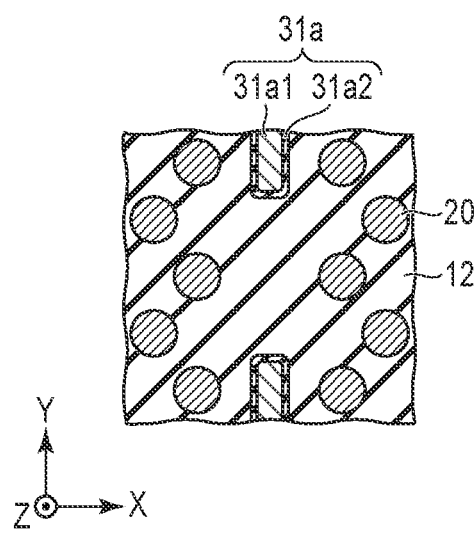
FIG. 13D is a cross-sectional view schematically illustrating the configuration of the semiconductor memory device according to the embodiment.

FIG. 13A corresponds to FIG. 1A and schematically illustrates the planar pattern. FIG. 13B is a cross-sectional view schematically illustrating a section taken along line B-B of FIG. 13A. FIG. 13C is a cross-sectional view schematically illustrating the configuration at a position corresponding to plane C-C of FIG. 13B. FIG. 13D is a cross-sectional view schematically illustrating the configuration at a position corresponding to plane D-D of FIG. 13B. Incidentally, in the example of FIG. 13A, FIG. 13B, FIG. 13C, and FIG. 13D, a slit side end portion of the conductive layer 11 further retreats than a slit side end portion of the insulating layer 12 when the metal material filling a part in the slit is removed and the conductive layer 11 is separated in the Z direction, in the replacement process of forming the conductive layer 11, and the modified example to be described below is assumed to have the same configuration.

FIG. 14A, FIG. 14B, FIG. 14C, and FIG. 14D illustrate the configuration of the semiconductor memory device according to the first modified example of the present embodiment. A mutual relationship among FIG. 14A, FIG. 14B, FIG. 14C, and FIG. 14D is the same as a mutual relationship among FIG. 13A, FIG. 13B, FIG. 13C, and FIG. 13D. In the modified example, the length in the Y direction of the second portion 31b of the first partition structure 31 is reduced. For this reason, in the replacement process, the metal material disappears just under the second portion 31b as a result that the retreat of the metal material from both sides in the Y direction of the second portion 31b proceeds, and the conductive layer 11 does not exist just under the second portion 31b. Therefore, each portion between the first partition structure 31 and the second partition structure 32 adjacent in the X direction can be configured as one block sharing the word line.

FIG. 15A and FIG. 15B illustrate a configuration of the semiconductor memory device according to a second modified example of the present embodiment. A mutual relationship between FIG. 15A and FIG. 15B is the same as a mutual relationship between FIG. 13A and FIG. 13B. In the modified example, the first portions 31a and the second portions 31b of the first partition structure 31 are arranged alternately in a stitch form in the Y direction. As already described, the total length in the Y direction of the first portions 31a is desirably longer than the total length in the Y direction of the second portions 31b. Therefore, the length in the Y direction of each first portion 31a is desirably longer than the length in the Y direction of each second portion 31b.

FIG. 16A and FIG. 16B illustrate a configuration of the semiconductor memory device according to a third modified example of the present embodiment. A mutual relationship between FIG. 16A and FIG. 16B is the same as a mutual relationship between FIG. 13A and FIG. 13B. In this modified example, the entire first portion 31a of the first partition structure 31 and the entire second partition structure (not illustrated) are formed of an insulating material.

The basic configurations of the above-described first, second, and third modified examples are the same as the configuration of the above-described embodiment, and the same advantages of the above-described embodiment can also be obtained from the first, second, and third modified examples.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a stacked layer body including a structure in which a plurality of conductive layers and a plurality of insulating layers are alternately stacked in a first direction;
a plurality of pillar structures each including a semiconductor layer extending in the first direction through the stacked layer body; and
a plurality of partition structures each extending in the first direction and a second direction intersecting the first direction in the stacked layer body, and partitioning the plurality of pillar structures into a plurality of groups in a third direction intersecting the first and second directions,
wherein
the partition structures include a first partition structure including at least two first portions and at least one second portion arranged in the second direction, the second portion being located between the first portions adjacent to each other in the second direction,
each of the first portions includes a first conductive portion extending in the first direction from one end in the first direction to another end in the first direction of the stacked layer body,
the second portion extends in the first direction from the one end of the stacked layer body and terminates at a position between the one end and the other end of the stacked layer body,
a total length of the at least two first portions in the second direction is longer than a total length of the at least one second portion in the second direction,
a width of one of the at least one second portion in the third direction is smaller than a width of one of the at least two first portions in the third direction,
a plurality of the conductive layers which are located on a side of the other end of the stacked layer body with respect to the position between the one end and the other end of the stacked layer body overlap the second portion in the first direction, and
each of the overlapped portions of the conductive layers extends continuously in the second direction from one of two first portions to another one of the two first portions, the two first portions being adjacent to each other in the second direction via the second portion.

2. The device of claim 1, wherein
the second portion is formed of an insulating material.

3. The device of claim 1, wherein
the second portion divides a predetermined number of the conductive layers in the third direction, and
the predetermined number of the conductive layers are used as gate electrodes of select transistors of a NAND string.

4. The device of claim 1, further comprising:
a semiconductor portion on which the stacked layer body is provided,
wherein the first conductive portion is connected to the semiconductor portion.

5. The device of claim 1, further comprising:
a wiring overlapping the first partition structure as viewed from the first direction, the wiring electrically connecting the first portions adjacent to each other in the second direction with each other.

6. The device of claim 1, wherein
the partition structures further include a second partition structure which is adjacent to an extending portion in the third direction, the extending portion including the at least two first portions and the at least one second portion in the first partition structure, and
the second partition structure includes a second conductive portion extending in the first direction from the one end to the other end of the stacked layer body wholly in the second direction along the extending portion of the first partition structure.

7. A semiconductor memory device comprising:
a stacked layer body including a structure in which a plurality of conductive layers and a plurality of insulating layers are alternately stacked in a first direction;
a plurality of pillar structures each including a semiconductor layer extending in the first direction through the stacked layer body; and
a plurality of partition structures each extending in the first direction and a second direction intersecting the first direction in the stacked layer body, and partitioning the plurality of pillar structures into a plurality of groups in a third direction intersecting the first and second directions,
wherein
the partition structures include a first partition structure including at least two first portions and at least one second portion arranged in the second direction, the second portion being located between the first portions adjacent to each other in the second direction, each of the first portions includes a first conductive portion extending in the first direction from one end in the first direction to another end in the first direction of the stacked layer body, the second portion extends in the first direction from the one end of the stacked layer body and terminates at a position between the one end and the other end of the stacked layer body, and the device further comprises a wiring overlapping the first partition structure as viewed from the first direction, the wiring electrically connecting the first portions adjacent to each other in the second direction with each other.

8. The device of claim 7, wherein
the second portion is formed of an insulating material.

9. The device of claim 7, wherein
the second portion divides a predetermined number of the conductive layers in the third direction, and
the predetermined number of the conductive layers are used as gate electrodes of select transistors of a NAND string.

10. The device of claim 7, further comprising:
a semiconductor portion on which the stacked layer body is provided,
wherein the first conductive portion is connected to the semiconductor portion.

11. The device of claim 7, wherein
the partition structures further include a second partition structure which is adjacent to an extending portion in the third direction, the extending portion including the at least two first portions and the at least one second portion in the first partition structure, and
the second partition structure includes a second conductive portion extending in the first direction from the one end to the other end of the stacked layer body wholly in the second direction along the extending portion of the first partition structure.

12. The device of claim 11, wherein
the wiring further electrically connects the first portions with the second partition structure.

13. A semiconductor memory device comprising:
a stacked layer body including a structure in which a plurality of conductive layers and a plurality of insulating layers are alternately stacked in a first direction;
a plurality of pillar structures each including a semiconductor layer extending in the first direction through the stacked layer body;
a plurality of partition structures each extending in the first direction and a second direction intersecting the first direction in the stacked layer body, and partitioning the plurality of pillar structures into a plurality of groups in a third direction intersecting the first and second directions; and
an intermediate structure provided between the partition structures adjacent to each other in the third direction, the intermediate structure extending in the first direction from one end in the first direction of the stacked layer body and terminating at a position between the one end and another end in the first direction of the stacked layer body, wherein
the partition structures include a first partition structure including at least two first portions and at least one second portion arranged in the second direction, the second portion being located between the first portions adjacent to each other in the second direction, each of the first portions extends in the first direction from the one end to the other end of the stacked layer body, the second portion extends in the first direction from the one end of the stacked layer body and terminates at the position between the one end and the other end of the stacked layer body, the second portion divides a predetermined number of the conductive layers in the third direction, the intermediate structure divides a same number of the conductive layers in the third direction as the predetermined number of the conductive layers divided by the second portion, the predetermined number is two or more, a plurality of the conductive layers which are located on a side of the other end of the stacked layer body with respect to the position between the one end and the other end of the stacked layer body overlap the second portion in the first direction, and each of the overlapped portions of the conductive layers extends continuously in the second direction from one of two first portions to another one of the two first portions, the two first portions being adjacent to each other in the second direction via the second portion.

14. The device of claim 13, wherein
the second portion is formed of a same material as a material of the intermediate structure.

15. The device of claim 13, wherein
the second portion is formed of an insulating material.

16. The device of claim 13, wherein
the predetermined number of the conductive layers are used as gate electrodes of select transistors of a NAND string.

17. The device of claim 13, wherein
a total length of the at least two first portions in the second direction is longer than a total length of the at least one second portion in the second direction.

18. The device of claim 13, wherein
a width of one of the at least one second portion in the third direction is smaller than a width of one of the at least two first portions in the third direction.

19. The device of claim 13, wherein
each of the first portions includes a first conductive portion extending from the one end to the other end of the stacked layer body.

20. The device of claim 19, wherein
the partition structures further include a second partition structure which is adjacent to an extending portion in the third direction via the intermediate structure, the extending portion including the at least two first portions and the at least one second portion in the first partition structure, and
the second partition structure includes a second conductive portion extending in the first direction from the one end to the other end of the stacked layer body wholly in the second direction along the extending portion of the first partition structure.

* * * * *